(12) United States Patent
Kerr

(10) Patent No.: US 6,435,247 B1
(45) Date of Patent: Aug. 20, 2002

(54) LAMINATOR ASSEMBLY HAVING AN ENDLESS TWO PLY OR HALF-LAP BELT

(75) Inventor: Roger S. Kerr, Brockport, NY (US)

(73) Assignee: Eastman Kodak Company, Rochester, NY (US)

( * ) Notice: Subject to any disclaimer, the term of this patent is extended or adjusted under 35 U.S.C. 154(b) by 2 days.

(21) Appl. No.: 09/772,797

(22) Filed: Jan. 30, 2001

(51) Int. Cl.[7] .................................................. B30B 5/04
(52) U.S. Cl. ..................... 156/555; 156/583.5; 100/151; 100/153
(58) Field of Search ................................ 156/555, 580, 156/582, 583.1, 583.5; 100/151, 153, 154; 425/371

(56) References Cited

U.S. PATENT DOCUMENTS

| | | | |
|---|---|---|---|
| 5,034,087 A | * 7/1991 | Denker et al. ............... | 156/555 |
| 5,145,548 A | * 9/1992 | Yamamoto ................... | 156/350 |
| 5,203,942 A | 4/1993 | DeCook et al. | |
| 5,268,559 A | * 12/1993 | Jacobs ......................... | 219/216 |
| 5,272,967 A | * 12/1993 | Held .......................... | 100/93 P |
| 5,311,269 A | * 5/1994 | Aslam et al. ................ | 355/285 |
| 5,478,434 A | 12/1995 | Kerr et al. | |
| 5,531,854 A | * 7/1996 | Kerr et al. ................... | 156/234 |

* cited by examiner

*Primary Examiner*—James Sells
(74) *Attorney, Agent, or Firm*—Buskop Law Group

(57) ABSTRACT

A laminator assembly utilizing either an endless multi-ply belt (27) or a half-lap belt and another endless belt and a roller arrangement (43) to apply pressure to media (55) to be laminated and to convey the media (55) in a controlled manner to pressure rollers.

39 Claims, 9 Drawing Sheets

LAMINATOR ASSEMBLY HAVING AN ENDLESS TWO PLY OR HALF-LAP BELT

CROSS REFERENCE TO RELATED APPLICATIONS

Reference is made to commonly-assigned U.S. patent application Ser. No. 09/133,243, filed Aug. 13, 1998, abandoned entitled LAMINATOR ASSEMBLY HAVING A PRESSURE ROLLER WITH A DEFORMABLE LAYER, by Roger S. Kerr; U.S. patent application Ser. No. 09/133, 248, filed Aug. 13, 1998, U.S. Pat. No. 6,213,183. entitled A LAMINATOR ASSEMBLY HAVING AN ENDLESS BELT, by Kerr et al.; U.S. patent application Ser. No. 09/315,367, filed May 18, 1999, abandoned entitled AN ENDLESS BELT STEERING MECHANISM, by Kerr et al., the disclosures of which are incorporated herein.

FIELD OF THE INVENTION

The present invention relates to the art of color proofing. In particular, to an improved endless belt used in a lamination assembly for preparing prepress color proofs, such as by the use of pressure and heat to laminate media together.

BACKGROUND OF THE INVENTION

Prepress color proofing is a procedure used in the printing industry, to create representative images of printed material. The representative images are used to check for color balance and other important image quality control parameters, without the high cost and time that is required to actually produce printing plates and set up a printing press to produce an example of a representative image. These representative images may require several corrections and may be reproduced several times to satisfy or meet the requirements of the customer, resulting in a large loss of profits and ultimately high costs to the customer.

Generally speaking pre-press color proofs sometimes-called "off press" proofs or prepress proofs, are one of three types. One a color overlay that employs an image on a separate base for each color. Two a single integral sheet process in which the separate color images are transferred by lamination onto a single base. And third a digital method in which the images are produced directly onto or transferred by lamination onto a single base from digital data.

In one typical process for a prepress color proofing system used in the printing industry, a multicolor original is separated into individual transparencies, called color separations, the three subtractive primaries and black. Typically a color scanner is used to create the color separations and in some instances more than four-color separations are used. The color separations are then used to create a color proof sometimes-called an "off press" proof or prepress proof as described above.

A color proofing laminator can be used to bond lamination sheets to receiver stock as a part of a color proofing system. The lamination sheets include a carrier and a layer of material to be applied to the receiver stock, which, in the case of a typical laminator, is a color donor. A lamination sheet is laid upon the receiver stock with the color donor end sandwiched between the carrier and the receiver stock forming a lamination sandwich.

A related laminator is described in U.S. Pat. No. 5,478, 434. As shown in that FIG. 1, a lamination sandwich 10 sits on an entrance table 20. A leading edge of lamination sandwich 10 is fed into a laminator 12 which includes an upper pressure roller and a lower pressure roller. Lamination sandwich 10 thereafter exits the upper and lower pressure rollers can be heated rollers. Upper pressure roller and the lower pressure roller come to rest on an exit table 14 undisturbed until the trailing edge is cool to the touch; whereupon the top-most carrier can be peeled away from receiver stock and from the transferred color donor. With the configuration of an upper pressure roller and a lower pressure roller as described above, the laminator is called a straight-through laminator. Further details of this type of lamination/delamination system can be found in the above. As an additional reference, U.S. Pat. No. 5,203,942 describes a lamination/delamination system as applied to a drum laminator.

While the above-described laminator works well for a few materials and in limited conditions, there are many conditions and materials that cannot be laminated successfully using the above-described laminator. Accordingly, belt laminators have been invented. A belt laminator using an endless belt is generally made by one of two manufacturing methods, dip skived or spun cast. Both methods have a relatively high cost and thickness of the belt is limited to an approximate range of 50 to 150 microns.

Both belt manufacturing process tend to have built in stresses which when used in a lamination application, form ripples that are transferred to the intended image making the intended image unacceptable. It should be noted that ripple, may also be caused by the lamination rollers used in the laminator. With the dip skived method of manufacturing for an endless belt, problems develop because it is difficult to manufacture without pinholes through the material caused by air bubbles which occur in the material to make the belt when that material is in the liquid state or during solvent out gassing during the curing process. This manufacturing defect can be easily transferred to the intended image, making the intended image unacceptable.

SUMMARY OF THE INVENTION

The present invention provides for an endless belt for a laminator, which overcomes the drawbacks noted above. The present invention provides an endless belt that allows for a larger thickness range to overcome ripple.

The present invention also provides an endless belt for a laminator that can be orientated to overcome the stresses that are built in the manufacturing process.

The present invention further provides an endless belt for a laminator that overcomes the pinholes that are formed in the manufacturing process.

BRIEF DESCRIPTION OF THE DRAWINGS

In the detailed description of the preferred embodiment of the invention presented below, reference is made to the accompanying drawings, in which.

DETAILED DESCRIPTION OF THE INVENTION

The present description will be directed, in particular, to elements forming part of, or cooperating more directly with, an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making image proofs on a paper receiver stock, since the usual proofing practice is to make a hard copy of the image proof on paper. The present invention, however, is not limited to making hard copies of proof images on paper, since it can produce hard copies of images on a wide variety and thickness of media that may be used in the printing process or other uses requiring heat and/or pressure to laminate.

Figure 1:
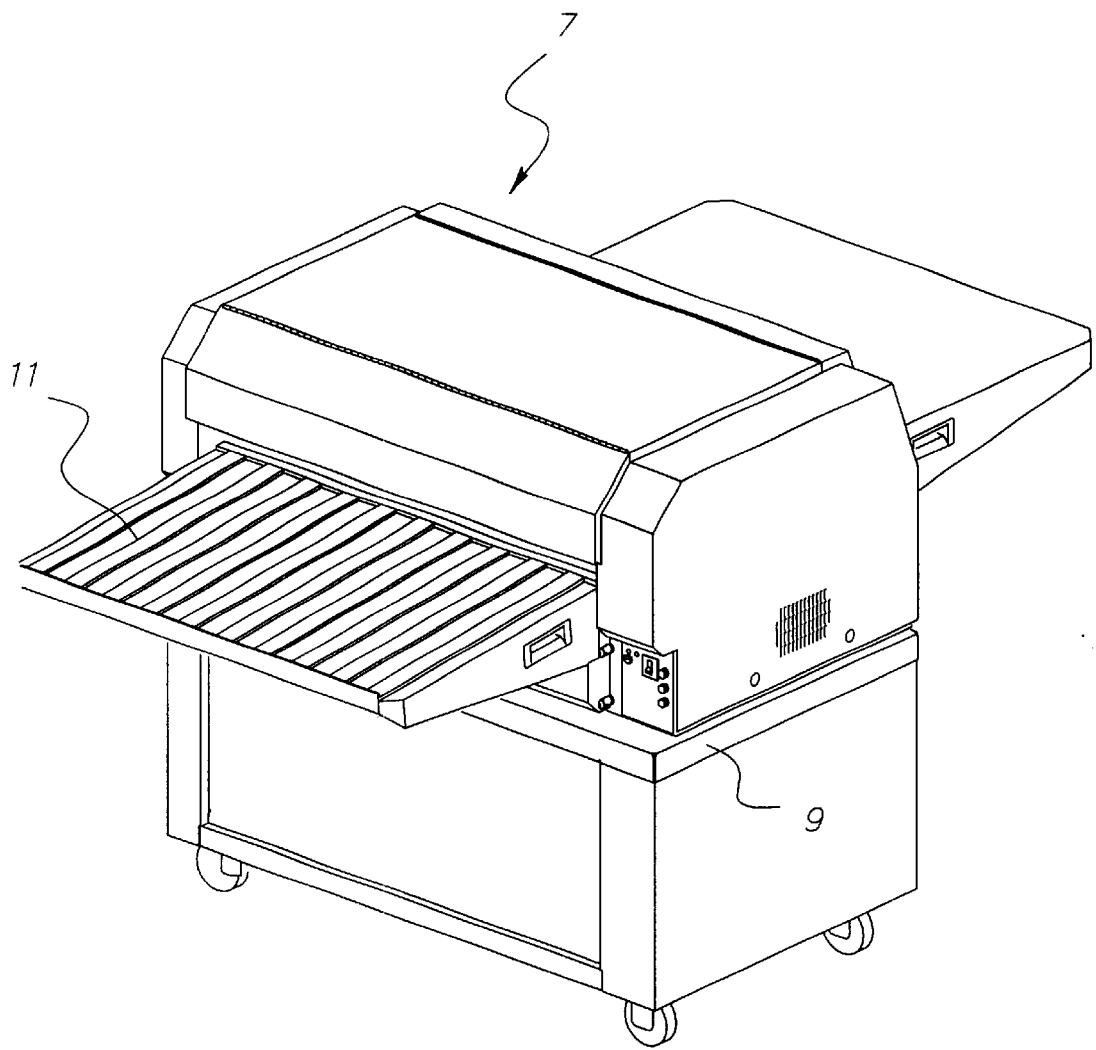
FIG. 1 is a perspective view showing a belted laminator.

Referring now to the drawings, wherein like reference numerals represent identical or corresponding parts throughout the several views. FIG. 1 shows an embodiment of the belt laminator 7 in accordance with the present invention.

Figure 2:
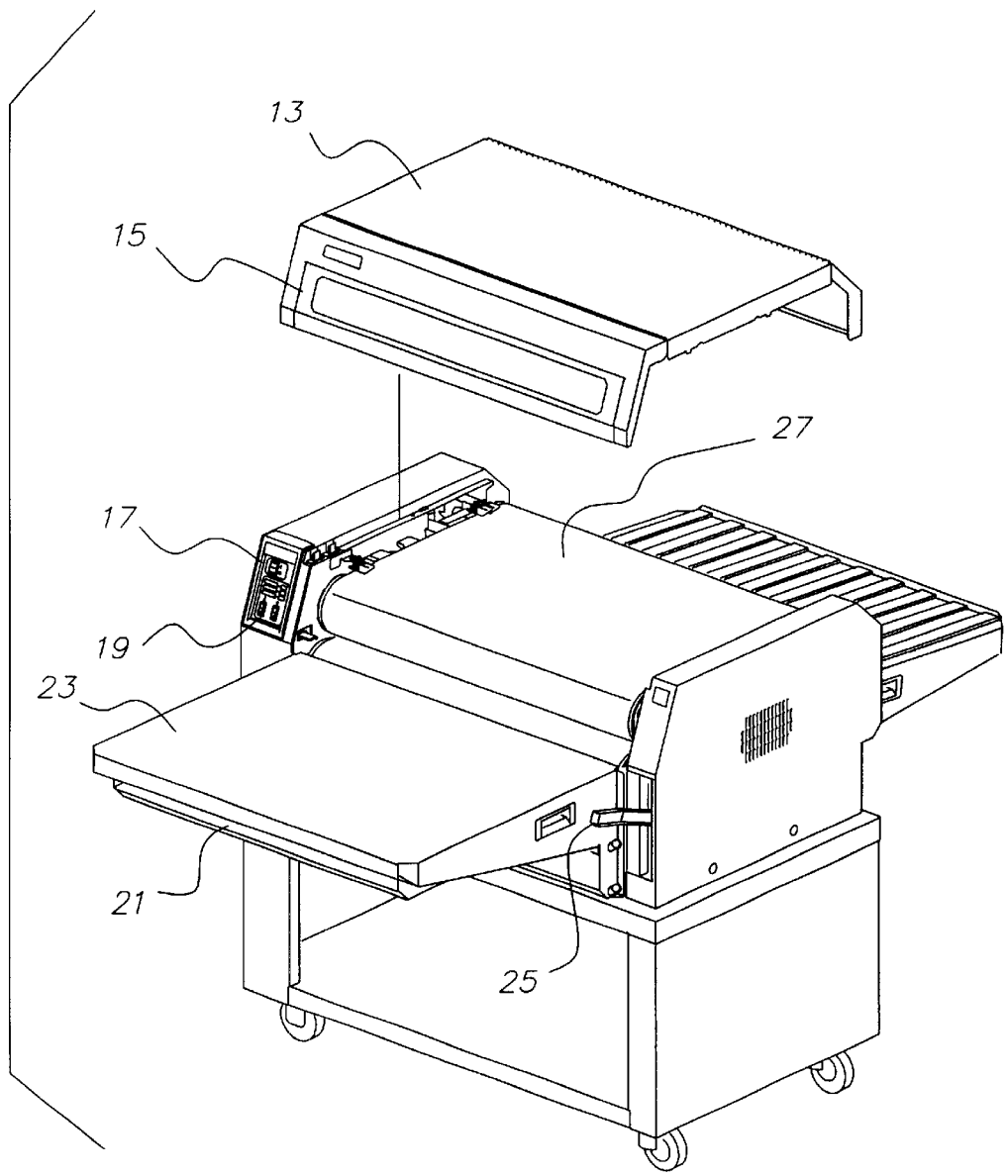
FIG. 2 is an exploded perspective view of the belted laminator shown in FIG. 1.

Belt laminator 7 has an exit tray 11. FIG. 2 shows an exploded view of the same belt laminator 7, having an cleaning door 13, a safety door 15, a control panel 17, safety switch paddle 19, a storage slot 21, and entrance tray assembly 23, a pressure lever 25 and the end less belt 27. The endless belt 27 can be a multi-ply belt, such as a two ply belt which consists of two one-ply belts which are adhered or bonded together with a layer of adhesive material 90, such as with epoxy. Other adhesive materials can be used, such as pressure sensitive adhesive or double stick tape or combinations thereof. The two single ply belt materials are specifically oriented so that the frequencies which occur in each of the two single ply belts are significantly dampened and their effect is eliminated or reduced.

Figure 3:
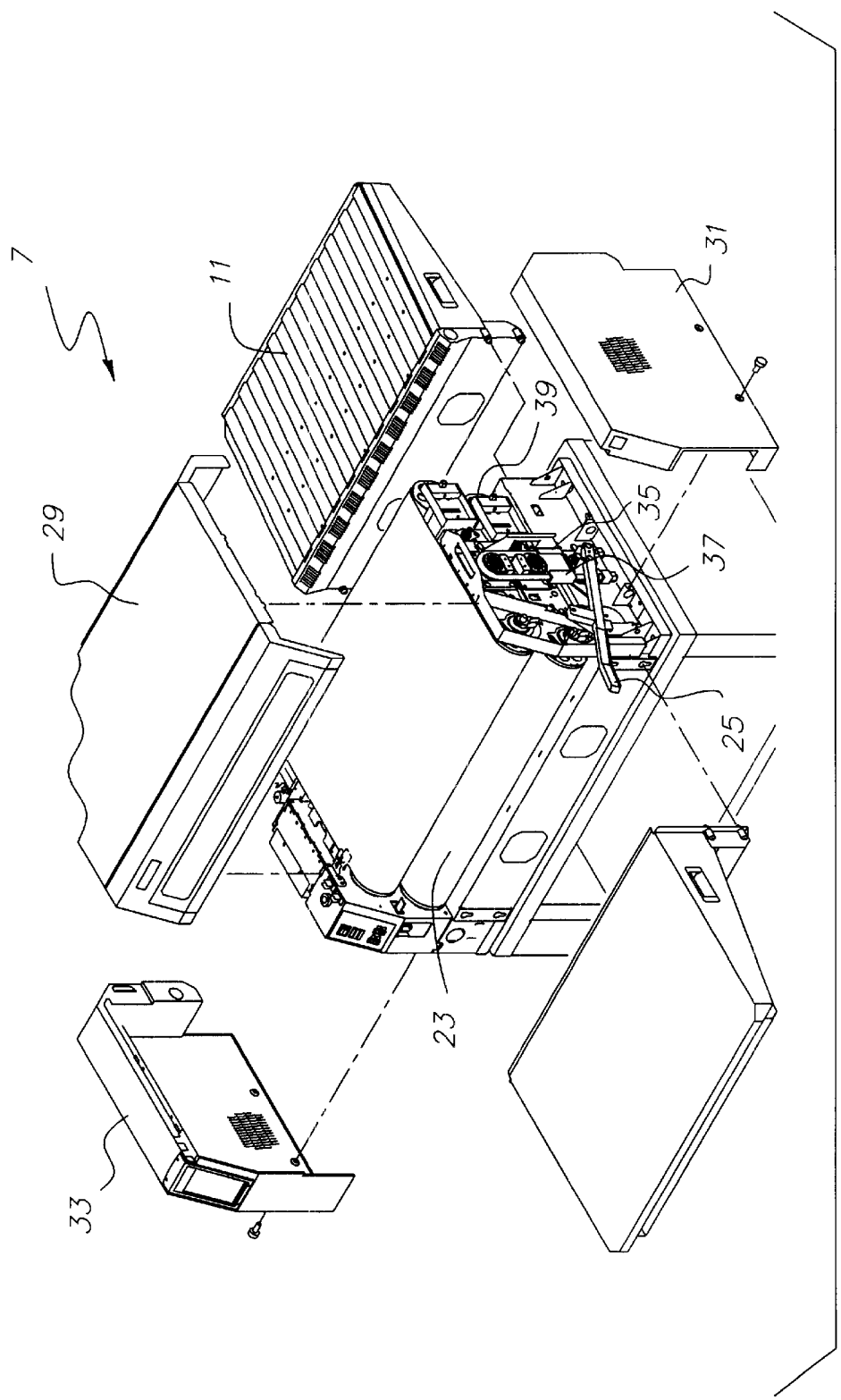
FIG. 3 is a detailed expanded view of an endless two-ply belt laminator.

FIG. 3 shows an exploded perspective view of a two-ply belt laminator 7 having a top cover 29, a heat shield (not shown), a right cover 31, and left cover 33. The control mechanism for belt laminator 7 can take the form of a clamp assembly 37 which includes pressure lever 25 and eccentric roller 35.

Figure 4:
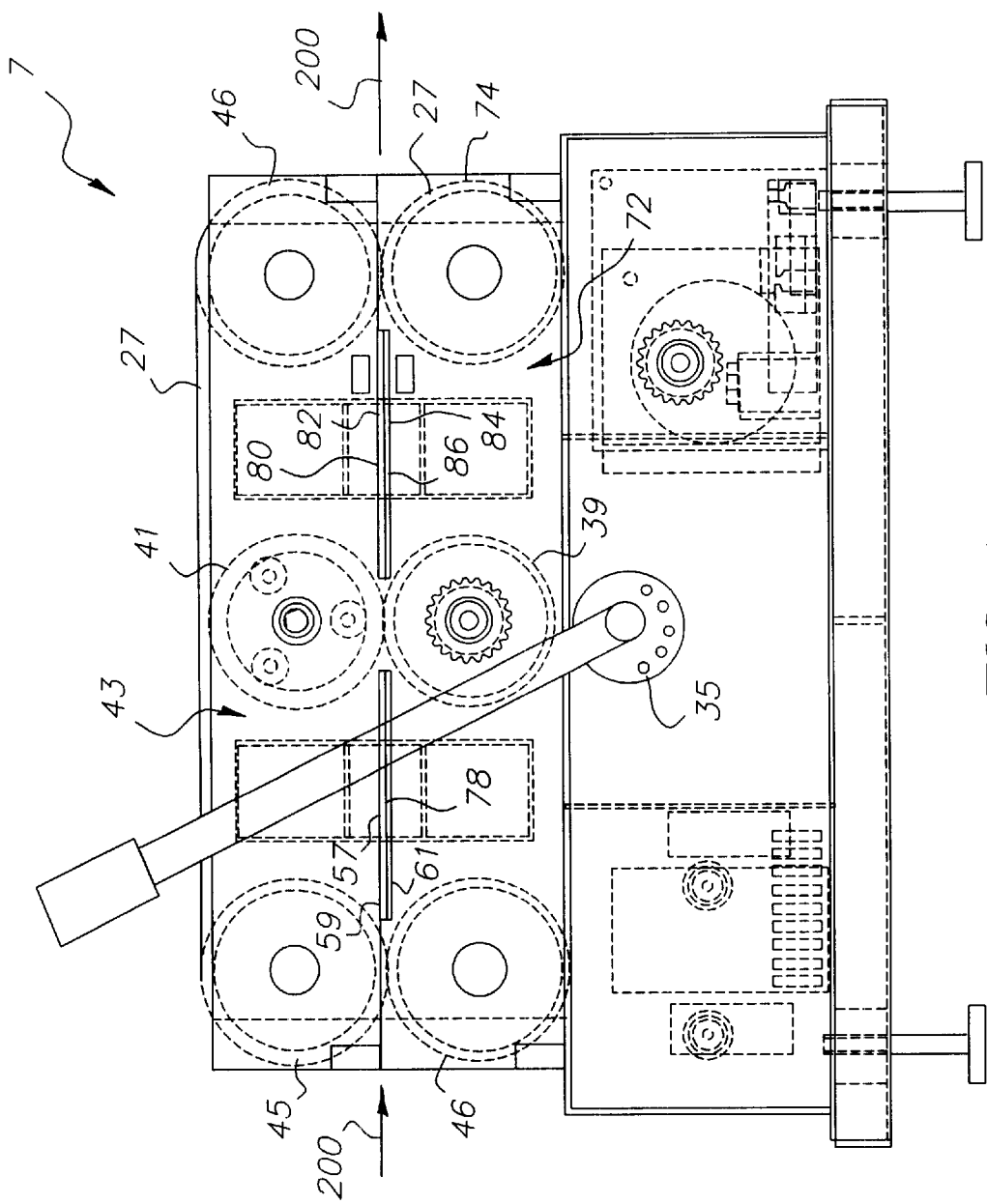
FIG. 4 is an end view of a laminator according to the present invention.

FIG. 4 shows an end view of the laminator assembly of FIG. 1. In this detail, the rollers are preferably at least one heated roller, however, this invention contemplates an embodiment using non-heated rollers. Rotation of pressure lever 25 causes eccentric roller 35 to abut against a first pressure roller 39 and thereby forcing pressure roller 39 against second pressure roller 41. The eccentric roller 35 can be modified to adjust the application of pressure and modify the width of nip portion 47. The belt laminator 7 can include a control mechanism (not shown) under said control panel 17 of FIG. 2, having a sensor 200. Control mechanisms can be operated to individually and/or selectively sense and/or control the temperature, or the pressure, or both, of each of pressure rollers 39 and 41 based on the type of media to be laminated. Once the media passes through rollers 39 and 41, a cooling mechanism 70, (not shown) can be used to cool the media as it exits nip portion 47. A pressure control assembly can be controlled from the control panel and further have a pressure control assembly for controlling pressure applied by the first and second rollers. This pressure control assembly can include a lever and roller arrangement which controls a movement of at least one of the first and second rollers. Alternatively, the pressure control assembly can be an automatic mechanism.

Figure 5:
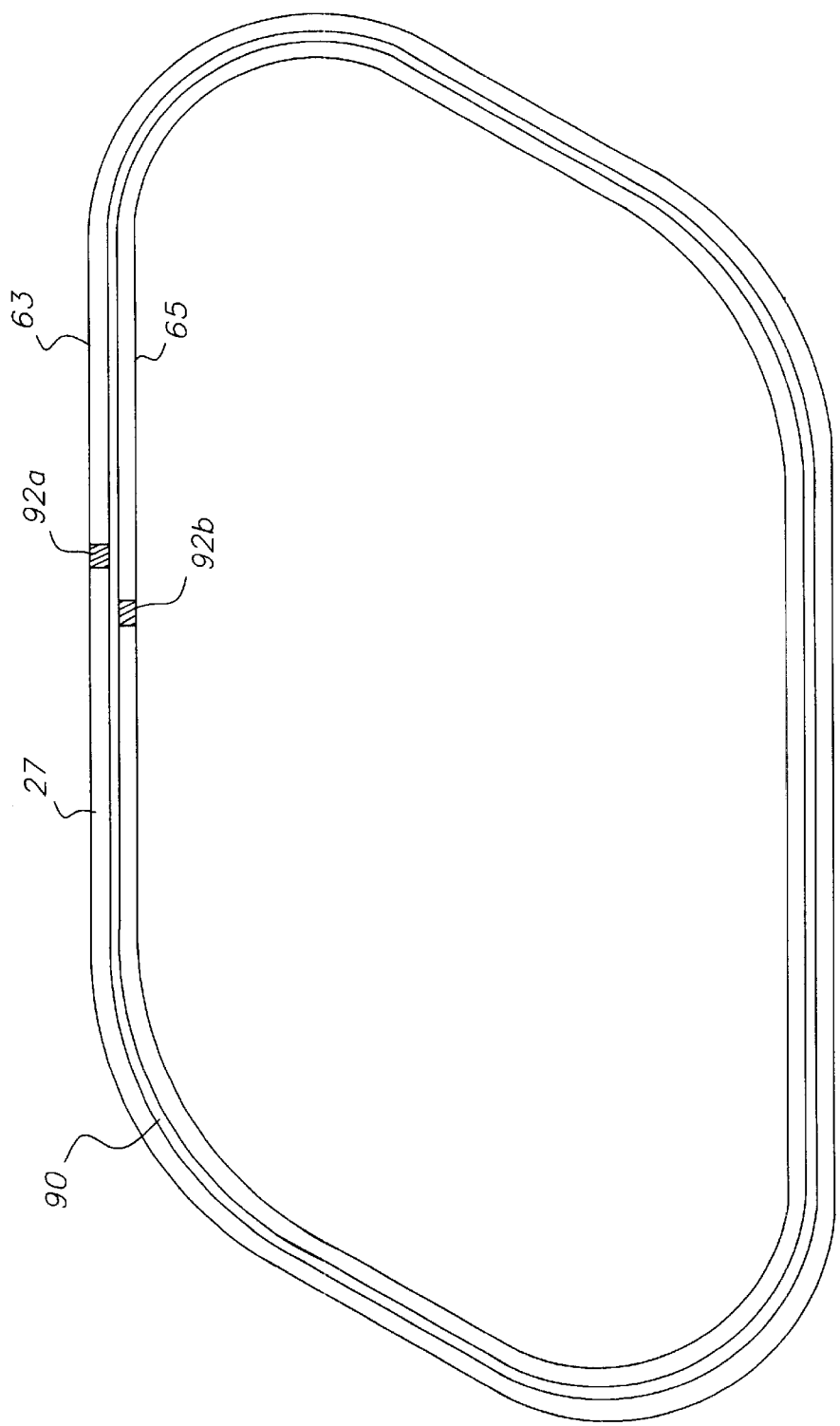
FIG. 5 is an end view of a two-ply belt.

This belted laminator 7 has one endless belt 27 which is a two ply belt. The detail of the two ply belt is shown in FIG. 5 which is a end view of the two ply belt alone.

Figure 6:
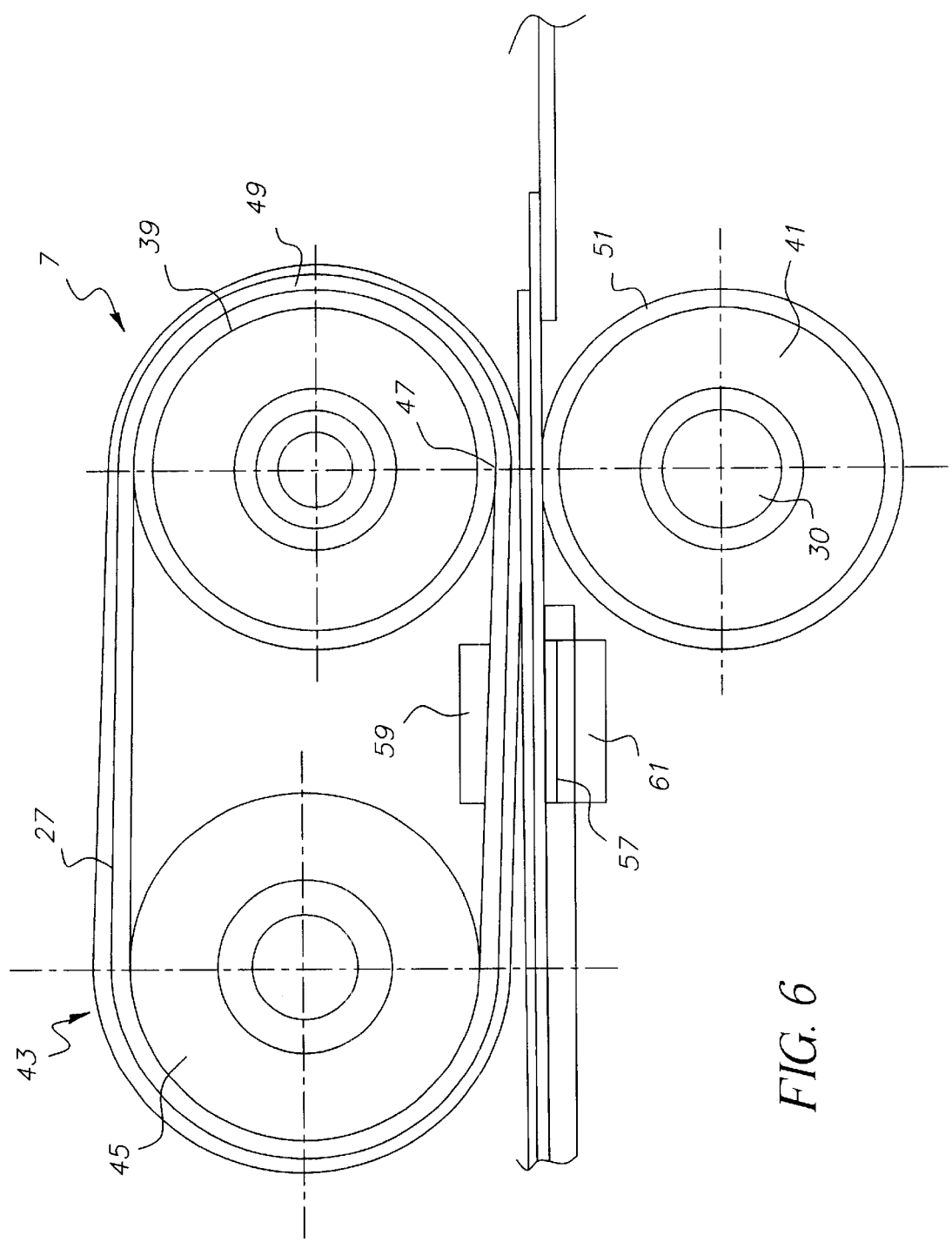
FIG. 6 is a side view of the detail of the laminator of FIG. 1.

FIG. 6 shows a further embodiment of the invention, using a two-ply belt 27. As shown, there is an upper roller arrangement 43 which comprises a first pressure roller 39, and idler roller 45, and a two-ply endless belt 27 surrounds pressure roller 39 and idler roller 45. Pressure roller 39 can include a first outer rubber roller cover 49. Laminator 7 further includes a second pressure roller 41 which opposes pressure roller 39. Pressure roller 41 also includes a second outer rubber cover 51.

Laminator 7 includes a guide member 53 which guides media 55 to nip portion 47 formed between pressure rollers 39 and 41. Pressure rollers 39 and 41 can be heated rollers having at least one heating core or being adapted to engage a heating element.

Laminator 7 has a plate assembly 57, wherein the plate assembly 57 is positioned upstream of pressure rollers 39 and 41. As shown in FIG. 6, plate assembly 57 includes a first plate 59 which is located within endless belt 27 and a second plate 61 which opposes first plate 59. The plates 61 and 59 define a nip portion 47 which is applied to media 55 prior to media 55 reaching the pressure rollers 39 and 41 and also to gain control of the media prior to the media entering the nip portion 47 between the pressure rollers 39 and 41. Although not shown in FIG. 6, a second roller arrangement could be configured wherein roller 41 has a complimentary idler roller and a second endless belt, being a two-ply belt or a half lap belt could be disposed around said second roller arrangement. It is also contemplated to be within the scope of the invention that one or more plates could be magnetic. It is an embodiment of this invention that laminator 7 has both an upstream plate assembly and a downstream identical plate assembly. Also a cooling mechanism can be used in laminator 7 to cool the downstream nip when the two-plate assembly embodiment is used. Pressure control means can be used in both roller assembly embodiments of this invention.

Returning to FIG. 4, the laminator assembly has an upper roller arrangement that includes first idler roller 45 and second idler roller 46 disposed on opposite ends of the upper roller arrangement 43. The lower roller arrangement 72 has third idler roller 74 and fourth idler roller 76 disposed on opposite ends of the lower roller arrangement 72.

Continuing in FIG. 4, the laminator assembly has an upstream plate assembly 57 located upstream of the first and second pressure rollers 39 and 41 with respect to a conveying direction of the media 200. The upstream plate assembly 57 applies an upstream pressure to the media prior to the media reaching a nip portion 47 between the first and second roller, 41 and 39.

The upstream plate assembly 57 further consists of a first upstream plate 59 positioned within the two-ply endless belt 27 so as to face the media passage and a second upstream plate 61 positioned within the two ply endless belt opposite the first upstream plate 59 so as to face the media passage. The first and second upstream plates define an upstream nip portion 78 and apply upstream pressure to the media 55 (not shown in FIG. 4) as the media 55 passes the upstream nip portion 78.

It is within the scope of the embodiment that at least one of either the first upstream plate or the second upstream plate, or both, are a magnetic plate.

The laminator assembly can include a downstream plate assembly 80 located downstream of the first and second rollers, 39 and 41, with respect to the conveying direction 200 of the media. The downstream plate assembly 80 applies a downstream pressure to the media after the media exits the nip portion 47 between the first and second rollers.

The downstream plate assembly 80 comprises a first downstream plate 82 positioned within the two ply endless belt 27 so as to face the media passage and a second downstream plate 84 is positioned within the two ply endless belt opposite the first downstream plate so as to face the media passage 78. The first and second downstream plates define a downstream nip portion 86 there between and applying downstream pressure to the media as the media passes the downstream nip portion 86. It is within the scope of the invention that at the first downstream plate, or the second downstream plate or both are magnetic plates.

The downstream plate assembly located downstream of the first and second rollers with respect to a conveying direction of said media can apply a downstream pressure to the media after said media exits a nip portion between said first and second rollers.

Returning to FIG. 5, regarding the plies of the two ply endless belts, first ply 63 and second ply 65, are preferably made from of a thermoplastic material, such as a: polyamide, a fluropolymer, a polyisocyanates, a polyphenylene sulfides, a polycarbonates, copolymers thereof, and combinations thereof. If polyamide is used, it is preferred to be a nylon 6,6, or nylon 6,10.

Dimensionally, the overall thickness of the two ply belt should range from 50 microns to 500 microns. The preferred thickness of the two ply belt would be 250 microns. The width of a typical half lap endless belt that would work with in the scope of the invention would be 250 microns, and could range from 50 and 300 microns. For each additional ply, the thickness of that ply would increase by up to 50% of the thickness of the first two plys, and could be thin, and only 10% of the original thickness of the two plies.

In another embodiment of the invention, the two ply belt would have filled seams to create a smooth effect during the operation of the laminator.

FIG. 6 shows is a view of a sheet of belt material 69 used in an endless belt showing the orientation of the frequency stresses in the material with phantom stress lines 88.

Figure 7:
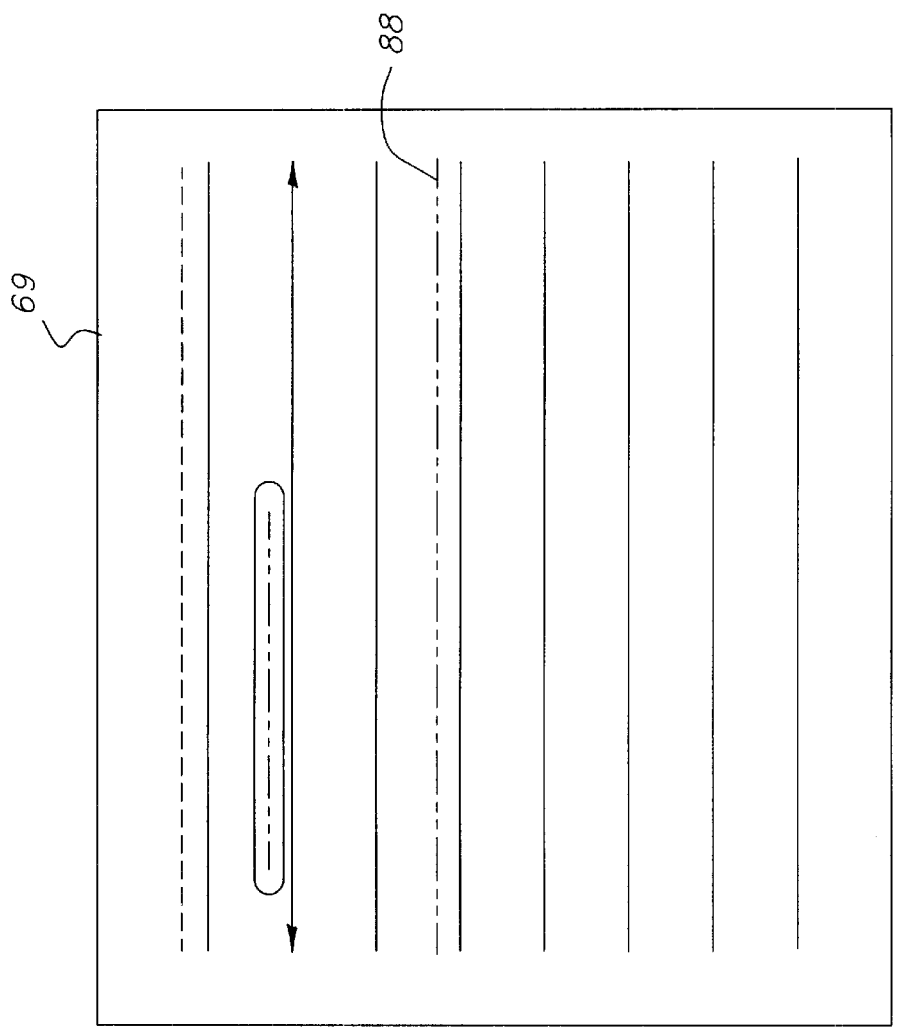
FIG. 7 is a view of material used in an endless belt showing the orientation of the frequency stresses in the material.

FIG. 7 shows is a perspective view of a two ply endless belt 27 showing how the frequencies of the stresses 88a in the first ply 63 cancel out the frequency of the stresses 88b in the second ply 65. The first ply 63 has seam 92a which is preferably a filled seam. The second ply 65 gas seam 92b, which is also preferably a filled seam.

Figure 8:
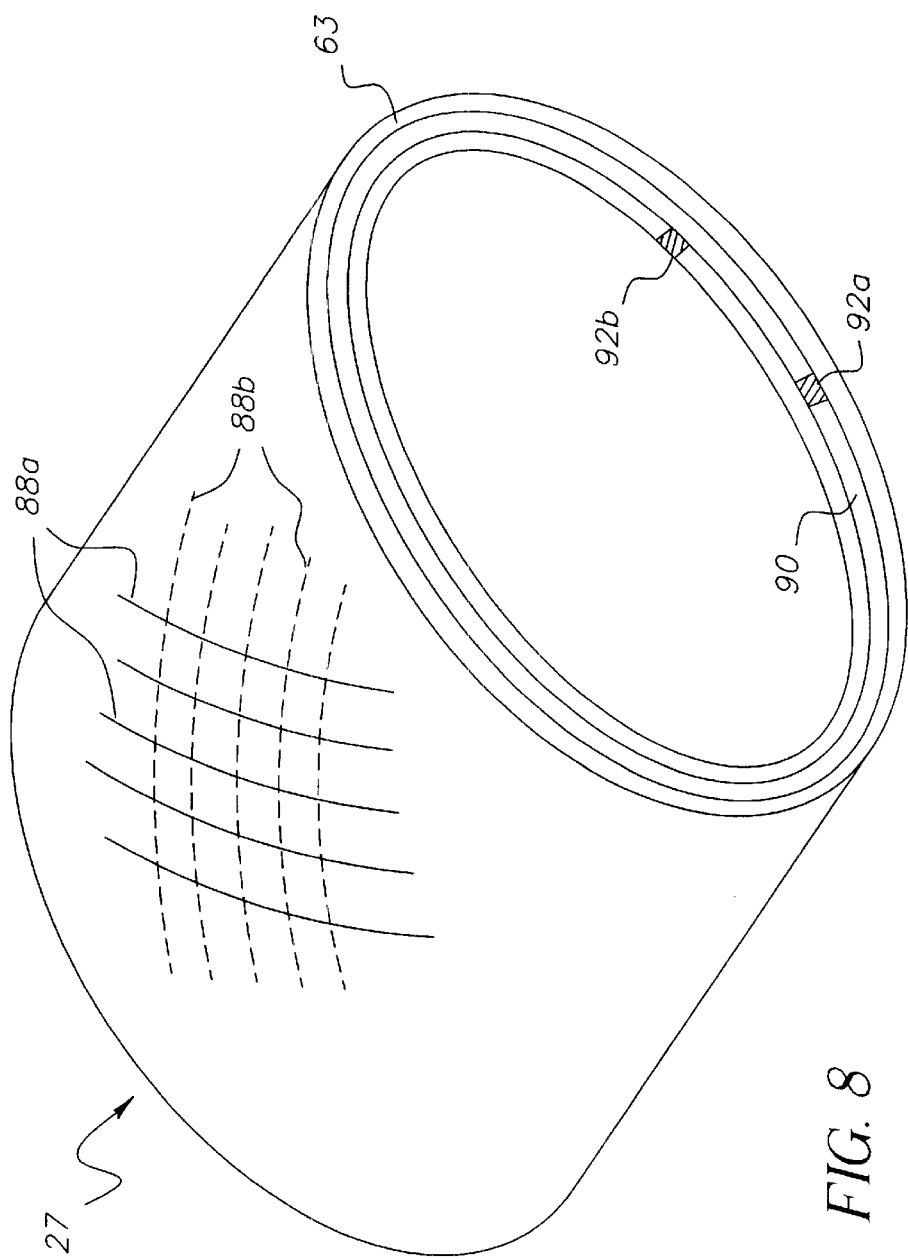
FIG. 8 is a perspective view of a two-ply endless belt showing how the frequencies of the stresses in the first ply cancel out the frequency of the stresses in the second ply.
Figure 9:
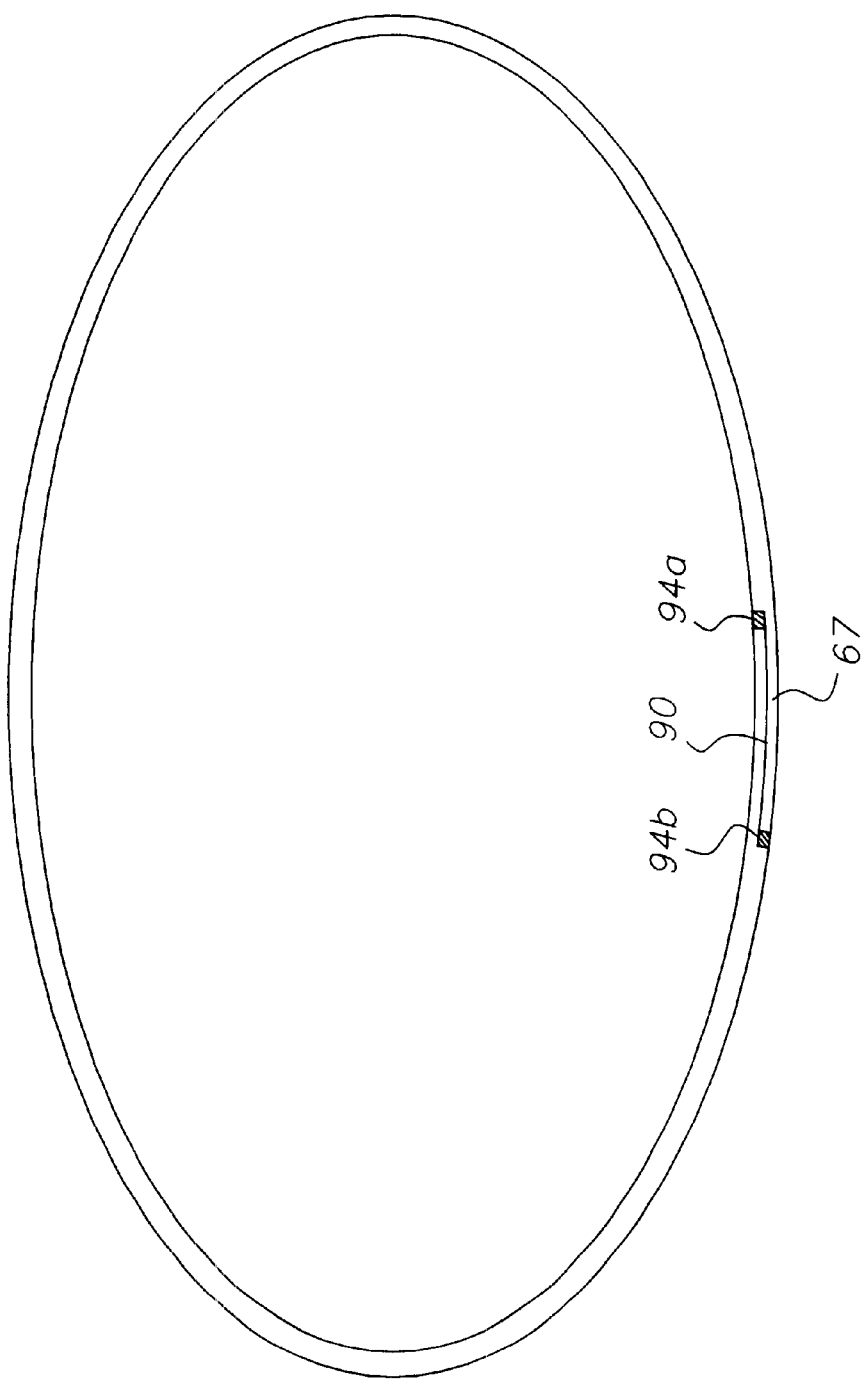
FIG. 9 is an end view of an assembled half-lap belt of the present invention.

FIG. 8 shows a half lap belt 67 which would work within the scope off the invention wherein the ends of the belt are lapped, one over the other at the point of connection.

The half lap belt embodiment of the present invention would use the same belt materials as in the multi ply or two ply embodiment. The half lap belt 67 is connected via an layer of adhesive material 90 which is identical to the materials used for the adhesive in the multi-ply embodiment. Two seams, an inside seam 94a and outside seam 94b, which connect the half lap belt are filled with the same material as the multiply embodiment.

The invention has been described in detail with particular reference to certain preferred embodiments thereof, but it will be understood that variations and modifications can be effected within the scope of the invention.

PARTS LIST

7. Belt laminator
9. Data plate
11. Exit tray
13. Cleaning door
15. Safety door
17. Control panel
19. Safety switch paddle
21. Storage slot
23. Entrance tray assembly
25. Pressure lever
27. Two ply or multi ply endless belt
29. Top cover
31. Right cover
33. Left cover
35. Eccentric roller
37. Clamp assembly
39. First pressure roller
41. Second pressure roller
43. Upper roller arrangement
45. First idler roller
46. Second idler roller
47. Nip portion
49. First outer rubber roller cover.
51. Second outer rubber cover
53. Guide member
55. Media
57. Upstream plate assembly
59. First upstream plate
61. Second upstream plate
62. Pressure settings
63. First ply of two ply belt
65. Second ply of two ply belt
67. Half lap belt
69. Sheet of belt material
70. Cooling Mechanism
72. Lower roller arrangement
74. Third idler roller
76. Fourth Idler roller
78. Upstream nip position
80. Downstream plate assembly
82. First downstream plate
84. Second downstream plate
86. Downstream nip portion
88. Phantom stress line
88a. Phantom stress line for first ply 63
88b. Phantom stress lines for second ply 65
90. Layer of adhesive material
92a. Seams of first ply
92b. Seams of second ply
94. An inside seam of the half lap belt
94b. An outside seam of a half lap belt
200. Conveying direction of media

What is claimed is:

1. A laminator assembly comprising:

a first roller arrangement arranged on a first end of a media passage;

an endless multi-ply belt disposed around said first roller arrangement;

a second roller arrangement arranged on a second end of said media passage which is opposite said first end;

an endless belt disposed around said second roller arrangement, said media passage being defined between facing portions of said endless belts which apply a first pressure to said media as said media passes through said media passage; and wherein said first roller arrangement comprises a first roller and said second roller arrangement comprises a second roller positioned opposite said first roller, said first and said second rollers applying a second pressure to media in said media passage as said media passes between said first and said second rollers, said second pressure being greater than said first pressure.

2. The laminator assembly of claim 1, wherein the endless belt is a multi-ply belt.

3. The laminator assembly of claim 1, wherein said endless belt is a half-lap belt.

4. The laminator assembly of claim 1, wherein said first roller arrangement and said second roller arrangements comprise at least one heated roller arrangement.

5. The laminator assembly of claim 1, wherein said endless multi-ply belt is a two-ply belt.

6. The laminator assembly of claim 1, wherein said endless multi-ply belt is formed from at least two one-ply belts laminated together.

7. The laminator of claim 1, wherein said multi-ply belt is formed from at least two one-ply belts, wherein said one-ply belts are adhered together using a material selected from the group: an adhesive material, a pressure sensitive adhesive, an epoxy material, a double stick tape, or combinations thereof.

8. The laminator of claim 1, wherein said multi-ply belt is formed from a first single-ply material which is oriented over a second single-ply material, such that the stress frequency of said first single-ply material cancels the stress frequency of said second single-ply material.

9. A laminator assembly comprising:

a first roller arrangement arranged on a first end of a media passage;

an endless half-lap ply belt disposed around said first roller arrangement;

a second roller arrangement arranged on a second end of said media passage which is opposite said first end;

an endless belt disposed around said second roller arrangement, said media passage being defined between facing portions of said endless belts which portions apply a first pressure to said media as said media passes through said media passage; and wherein said first roller arrangement comprises a first roller and said second roller arrangement comprises a second roller positioned opposite said first roller, said first and said second rollers apply a second pressure to media in said media passage as said media passes between said first and said second rollers, said second pressure being greater than said first pressure.

10. The laminator of claim 9, wherein said endless belt is a half-lap belt.

11. The laminator assembly of claim 9, wherein said first roller arrangement and said second roller arrangement comprises at least one heated roller.

12. The laminator assembly of claim 1, wherein said multi-ply belt has seams, said seams filled with a member of the group comprising: a material having the same physical properties as said multi-ply belt, and epoxy, or combinations thereof.

13. The laminator assembly of claim 9, wherein said half-lap belt has seams, said seams filled with a member of the group comprising: a material having the same physical properties as said half-lap belt, an epoxy, or combinations thereof.

14. The laminator assembly of claim 1, wherein the endless belts comprise a thermoplastic material.

15. The laminator assembly of claim 14, wherein the thermoplastic material is a member of the group comprising: polyamide, flluropolymer, polyisocyanates, polyphenylene sulfides, polycarbonates, copolymers thereof, and combinations thereof.

16. The laminator assembly of claim 15, wherein said polyamide is a member of the group comprising: nylon 6,6, and nylon 6,10.

17. The laminator assembly of claim 9, wherein the endless belts comprise a thermoplastic material.

18. The laminator assembly of claim 17, wherein the thermoplastic material is a member of the group comprising: polyamide, flluropolymer, polyisociynates, polyphenylene sulfides, polycarbonate, copolymers thereof, and combinations thereof.

19. The laminator assembly of claim 18, wherein said polyamide is a member of the group comprising: nylon 6,6 and nylon 6,10.

20. A laminator assembly according to claim 1, wherein said first roller arrangement further comprises first and second idler rollers disposed on opposite ends of said first roller arrangement, and said second roller arrangement comprises third and fourth idler rollers disposed on opposite ends of said second roller arrangement.

21. A laminator assembly according to claim 1, further comprising an upstream plate assembly located upstream of said first and second rollers with respect to a conveying direction of said media, said upstream plate assembly applying an upstream pressure to said media prior to said media reaching a nip portion between said first and second rollers.

22. A laminator assembly according to claim 21, wherein said upstream plate assembly comprises a first upstream plate positioned within said multi-ply endless belt so as to face said media passage and a second upstream plate positioned within said endless belt opposite said first plate so as to face said media passage, said first and second upstream plates defining an upstream nip portion and applying said upstream pressure to said media as said media passes said upstream nip portion.

23. A laminator assembly according to claim 22, wherein at least one said first upstream plate and said second upstream plate is a magnetic plate.

24. A laminator assembly according to claim 21, further comprising a downstream plate assembly located downstream of said first and second rollers with respect to said conveying direction of said media, said downstream plate assembly applying a downstream pressure to said media after said media exits said nip between said first and second rollers.

25. A laminator assembly according to claim 24, wherein said downstream plate assembly comprises a first downstream plate positioned within said two-ply endless belt so as to face said media passage and a second downstream plate positioned within said endless belt opposite said first downstream plate so as to face said media passage, said first and second downstream plates defining a downstream nip portion there between and applying said downstream pressure to said media as said media passes said downstream nip portion.

26. A laminator according to claim 25, wherein at least one of said first downstream plate and said second downstream plate is a magnetic plate.

27. A laminator according to claim 1, further comprising a downstream plate assembly located downstream of said first and second rollers with respect to a conveying direction of said media, said downstream plate assembly applying a downstream pressure to said media after said media exits a nip portion between said first and second rollers.

28. A laminator according to claim 24, wherein said downstream plate assembly comprises a first downstream plate positioned within said two-ply endless belt so as to face said media passage and a second downstream plate positioned within said endless belt opposite said first downstream plate so as to face said media passage, said first and second downstream plate defining a downstream nip portion there between and applying said downstream pressure to said media as said media passes said downstream nip portion.

29. A laminator according to claim 28, wherein at least one of said first and second downstream plates is a magnetic plate.

30. A laminator assembly according to claim 1, further comprising a heat shield which covers said first and second endless belts.

31. A laminator assembly according to claim 1, further comprising a cooling mechanism which cools said downstream nip portion.

32. A laminator assembly according to claim 9, further comprising a cooling mechanism which cools said downstream nip portion.

33. A laminator assembly according to claim 1, further comprising a pressure control assembly for controlling said second pressure applied by said first and second rollers.

34. A laminator assembly according to claim 33, wherein said pressure control assembly comprises a lever and roller arrangement which controls a movement of at least one of said first and second rollers.

35. A laminator assembly according to claim 33, wherein said pressure control assembly is an automatic mechanism.

36. A method of laminating media comprising the steps of:

passing a media to be laminated between a first and second multi-ply endless belts which apply a first pressure to said media; and providing a second pressure to said media passing between said first and second multi-ply endless belts by way of first and second opposing pressure rollers respectively located within each of said first and second two-ply endless belts.

37. A method according to claim 36, wherein at least one of said first and second pressure rollers is a heated pressure roller.

38. A method of laminating media comprising the steps of:

passing a media to be laminated between first and second pressure roller arrangements which apply a first pressure to said media, wherein at least one of said first and second pressure roller arrangements comprises an idler roller, pressure roller and a half-lap endless belt which surrounds said idler roller and said pressure roller; and applying a second pressure to said media passing between said first and second pressure arrangements by way of a plate assembly.

39. A method according to claim 38, wherein at least one of said pressure rollers is a heated pressure roller.

* * * * *